United States Patent [19]

Oshima

[11] Patent Number: 4,916,502

[45] Date of Patent: Apr. 10, 1990

[54] SEMICONDUCTOR DEVICE TO BE COUPLED WITH A CONTROL CIRCUIT BY A PHOTOCOUPLER

[75] Inventor: Seiichi Oshima, Hyogo, Japan

[73] Assignee: Mitsubishi Denki Kabushiki Kaisha, Tokyo, Japan

[21] Appl. No.: 406,179

[22] Filed: Sep. 13, 1989

Related U.S. Application Data

[63] Continuation of Ser. No. 152,494, Feb. 5, 1988, abandoned.

[30] Foreign Application Priority Data

Feb. 25, 1987 [JP] Japan .................................. 62-43427

[51] Int. Cl.[4] ............................................. H01L 27/14
[52] U.S. Cl. ........................................ 357/30; 357/71; 357/38; 357/53
[58] Field of Search .................... 357/19, 30, 30 O, 71, 357/81, 39, 38, 38 L, 38 A, 53

[56] References Cited

FOREIGN PATENT DOCUMENTS

| 0199635 | 10/1986 | European Pat. Off. | ............... 357/71 |
| 60-4241 | 1/1985 | Japan | ................................... 357/71 |
| 60-187038 | 9/1985 | Japan | ................................... 357/71 |
| 60-224244 | 11/1985 | Japan | ................................... 357/71 |
| 61-81655 | 4/1986 | Japan | ................................... 357/71 |

Primary Examiner—William Mintel
Attorney, Agent, or Firm—Oblon, Spivak, McClelland, Maier & Neustadt

[57] ABSTRACT

A multilayer substrate (18) has two ceramic plates (111, 114) and a shielding metal layer (113) provided between the ceramic plates. An electronic circuit having a TRIAC (7) and a photocoupler (5) is provided on the multilayer substrate. The shielding metal layer and a second main electrode (T$_2$) of the TRIAC are connected with each other by solder filled in a through hole 116. External noise is captured by the shielding metal layer, to be propagated to the second main electrode.

7 Claims, 5 Drawing Sheets

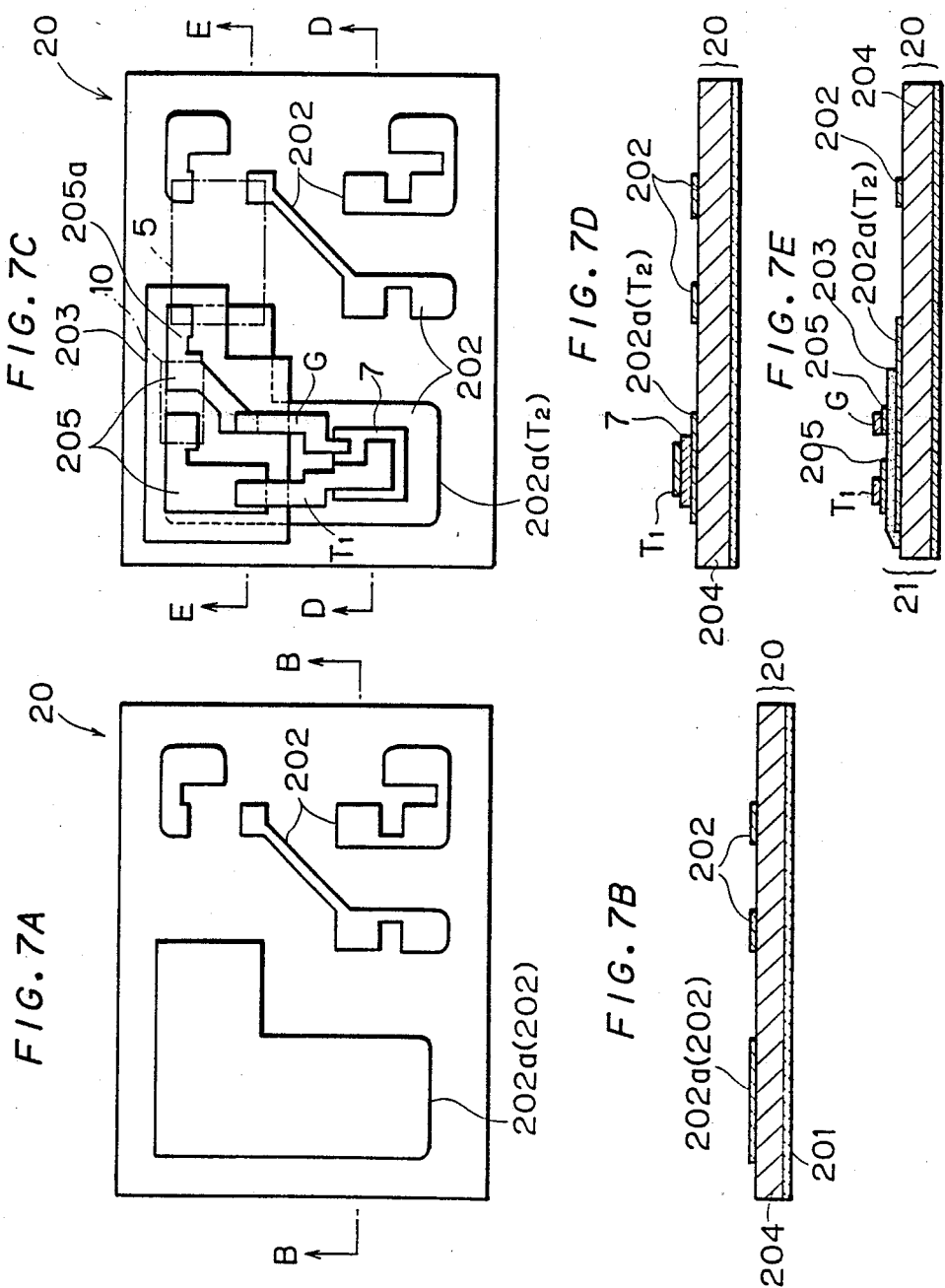

SEMICONDUCTOR DEVICE TO BE COUPLED WITH A CONTROL CIRCUIT BY A PHOTOCOUPLER

This application is a continuation of application Ser. No. 152,494 filed on Feb. 5, 1988, now abandoned.

BACKGROUND OF THE INVENTION

1. Field of the Invention

The present invention relates to a semiconductor device to be coupled with a control circuit by a photocoupler, and more particularly, it relates to a technique of preventing a malfunction of the semiconductor device caused by external noise.

2. Description of the prior Art

A semiconductor device having a power semiconductor element such as a triode AC switch (TRIAC) or a thyristor is employed under high voltage, in order to generate high power. On the other hand, a control signal to be supplied to a control electrode of the power semiconductor element is generated by a control circuit which operates under low voltage. Therefore, the power semiconductor element and the control circuit are often coupled with each other through a photocoupler, in order to transfer the control signal from the control circuit to the power semiconductor element while maintaining electric insulability between the same. Such a semiconductor device is called "solid-state relay".

In such a semiconductor device coupled with the control circuit through the photocoupler, a malfunction may be caused by external noise, due to a structural character of the semiconductor device. FIGS. 1 and 2 are a sectional view and a circuit diagram showing a conventional solid-state relay, respectively, provided for clear understanding of such a problem. A semiconductor device (solid-state relay) shown in FIG. 2 is provided with a TRIAC 7 serving as a power semiconductor element. The TRIAC 7 has a first main electrode $T_1$, a second main electrode $T_2$ and a gate electrode A control signal for the TRIAC 7 is generated in a control circuit (not shown), to be supplied to input terminals 3 and 4. This control signal is supplied through a resistor 8 to a light emitting diode 5a, which in turn emits light. The light emitting diode 5a and a bidirectional photothyristor 5b form a TRIAC coupler (photocoupler) The bidirectional photothyristor 5b is connected between the first and second main electrodes $T_1$ and $T_2$ of the TRIAC 7.

On the other hand, a load 18 and an AC power source 16 are connected between the first and second main electrodes $T_1$ and $T_2$ through output terminals 1 and 2, as shown in FIG. 3. A resistor 10 is interposed between the main electrode $T_1$ and the gate electrode G.

Therefore, when light is applied to the bidirectional photothyristor 5b from the light emitting diode 5a, current flows through the bidirectional photothyristor 5b and the resistor 10. The TRIAC 7 is turned on by a voltage drop thus developed at the resister 10. When voltage supplied between the main electrodes $T_1$ and $T_2$ from the AC power source 16 is lowered, the TRIAC 7 is turned off. A series combination of a capacitor 8 and a resistor is interposed between the main electrodes $T_1$ and $T_2$, in order to absorb surge current.

Within the aforementioned elements, the terminals 1 to 4, the TRIAC coupler 5 and the TRIAC 7 are shown in FIG. while the remaining ones are not shown in FIG. 1. The semiconductor circuit shown in FIG. 2 is mounted on an insulating substrate. The insulating substrate 11 is prepared by a ceramic substrate or a printed board, for example, and is mounted on the upper surface of a metal plate 12 for heat radiation. The semiconductor circuit having the aforementioned elements is contained in a case 13, and sealed by a resin member 14.

The TRIAC 7 generates a considerable amount of heat in operation. The heat is transferred to the heat radiating metal plate 12 through the insulating substrate 11, to be diffused to a radiator (not shown on which the metal plate 12 is mounted. Therefore, the insulating substrate 11 is preferably as small as possible in thickness, so far as electric insulability is ensured between the semiconductor circuit and the heat radiating metal plate 12. Also in case of employing an insulated metal substrate formed by integrating the metal plate 12 and the insulating substrate an insulation layer corresponding to the insulating substrate 11 is preferably small in thickness. Thickness of the insulating substrate is selected within a range of 100 to 500 $\mu$m, for example.

When the insulating substrate 11 is thus small in thickness, a capacitor $C_S$ is caused between the semiconductor circuit and the metal plate 12, as shown in FIG. 3. If external noise 17, which is symbolically shown as a noise source in FIG. is applied between a ground level and the semiconductor circuit, current flows through the resistor 10 and the capacitor $C_S$, whereby voltage is developed across the resistor 10. Due to such voltage, current flows between the gate electrode G and the first main electrode $T_1$ through the interior of the TRIAC 7. This current functions as a trigger signal for the TRIAC 7, whereby the TRIAC 7 is undesirably turned on. As a result, the semiconductor device malfunctions by the external noise.

SUMMARY OF THE INVENTION

The present invention is directed to a semiconductor device having a semiconductor element operating in response to a signal supplied through a photocoupler, which device comprises: (a) a heat radiation metal plate for diffusing heat generated in the semiconductor device; (b) a multilayer member, being provided on the heat radiating metal member having (b-1 an insulating substrate, (b-2) a shielding metal layer provided on the device against external noise, and (b-3) an insulation device against external noise, and (b-3) an insulation layer provided on the shielding metal layer, and (c) an electronic circuit being provided on the multilayer member and having the photocoupler and the semiconductor element, the shielding metal layer being connected to a portion of the electronic circuit other than a control electrode of the semiconductor element.

In the semiconductor device according to the present invention, external noise is captured by the shielding metal layer. Charges induced by the external noise are discharged to the portion of the semiconductor circuit other than the control electrode of the semiconductor element. The control electrode is applied with no such charges induced by the external noise, whereby the semiconductor element is prevented from a malfunction.

Accordingly, an object of the present invention is to provide a semiconductor device which can prevent a malfunction caused by external noise while ensuring a high heat radiation characteristic.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7A to 7E are explanatory diagrams of a multilayer member employed in a second embodiment of the present invention.

DESCRIPTION OF THE PREFERRED EMBODIMENTS

Figure 4A:
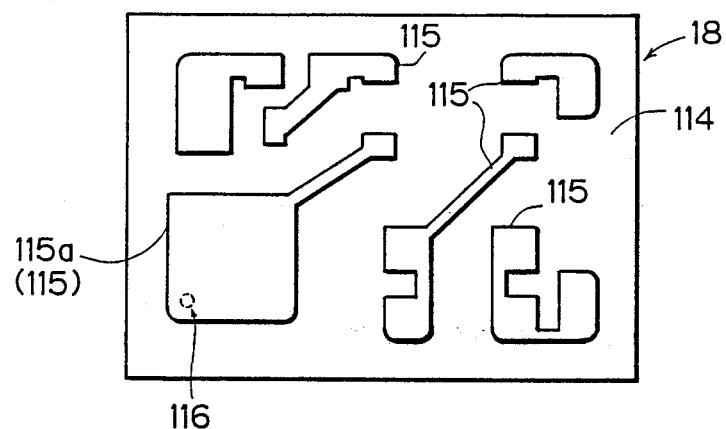
FIGS. 4A and 4B are explanatory diagrams of a multilayer member employed in a first embodiment of the present invention.
Figure 4B:
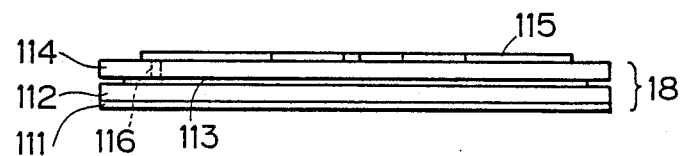
Figure 5:
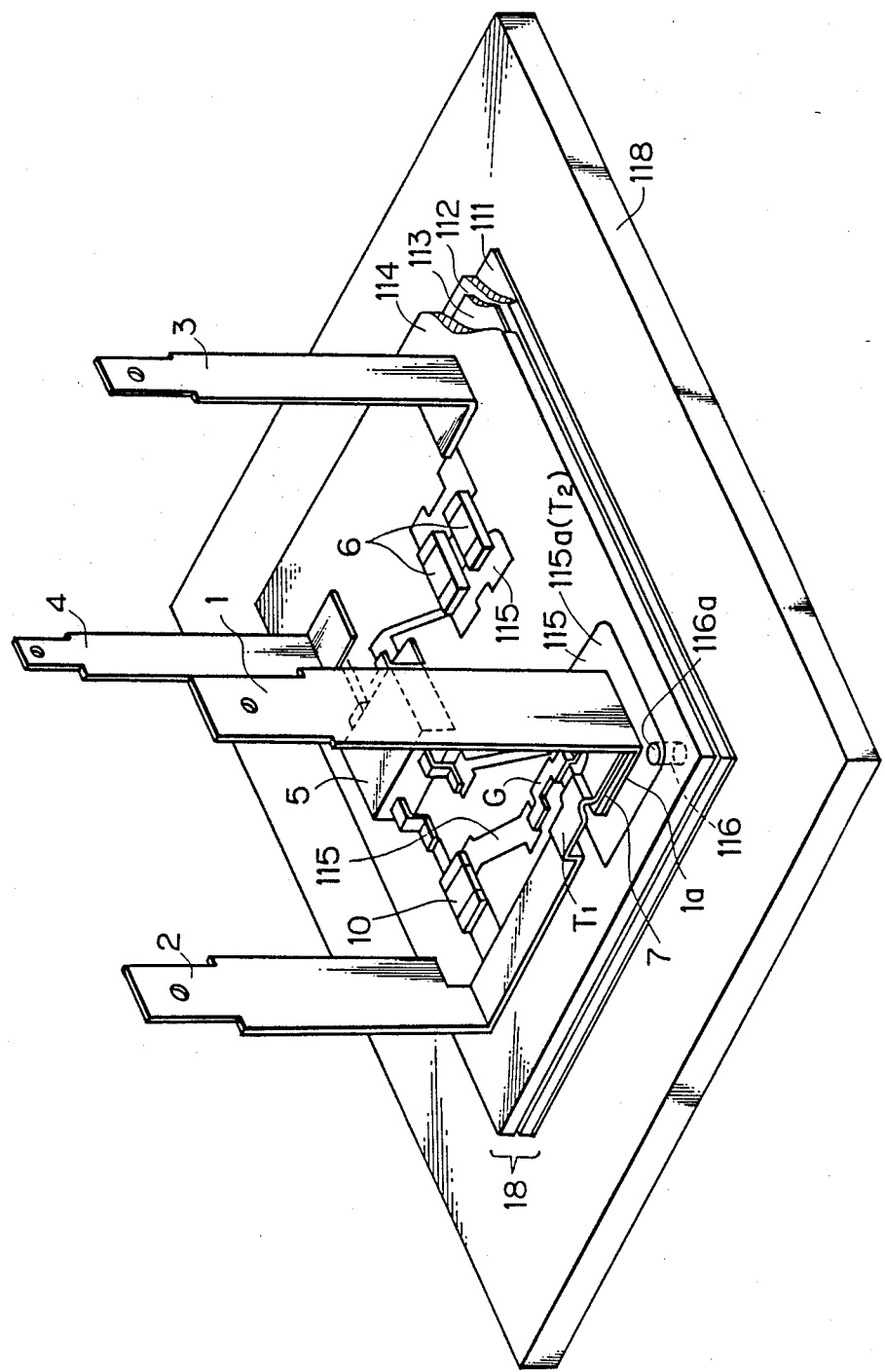
FIG. 5 is a perspective view showing the first embodiment.

FIG. 5 is a fragmented perspective view showing internal structure of a semiconductor device according to a first embodiment of the present invention. FIGS. 4A and 4B are a top plan view and a front elevational view, respectively, showing a multilayer substrate employed in the first embodiment. Referring to FIGS. 4A and 4B, a multilayer substrate 18 is in a four-layer structure obtained by laminating a metal layer 111, a first ceramic plate (insulating substrate) 112, an electrostatic shielding metal layer 113 and a second ceramic plate (insulation layer) 114 in the said order. The metal layer 111 is obtained by metallizing the entire lower surface of the first ceramic plate 112 by molybdenum-manganese alloy, for example. The lower surface of the metal layer 111 is plated by nickel. The shielding metal layer 113 is also obtained by metallizing the upper surface of the first ceramic plate 112 and/or the lower surface of the second ceramic plate 114 by molybdenum-manganese alloy. The shielding metal plate 113 covers most of the surface area(s) of the ceramic plate(s) 112 and/or 114 to a position slightly inside the periphery of the multilayer substrate 18. The ceramic plates 112 and 114 are soldered to each other after the shielding metal layer 113 is completely formed. The metallization processing may be performed by flame coating, vacuum evaporation or sputtering, for example. The multilayer substrate 18 of the first embodiment is one of the best modes of a "multilayer member", which is an important element of the present invention.

A metal pattern layer (conductive pattern layer) 115 is provided on the upper surface of the second ceramic plate 114 by metallization and plating of the same. Semiconductor elements and other circuit components are mounted on the metal pattern layer 115, as hereinafter described. As shown in FIG. 5, the multilayer substrate 18 is soldered on the upper surface of a heat radiation metal plate 118 for diffusing or radiating head generated in the semiconductor device.

Figure 1:
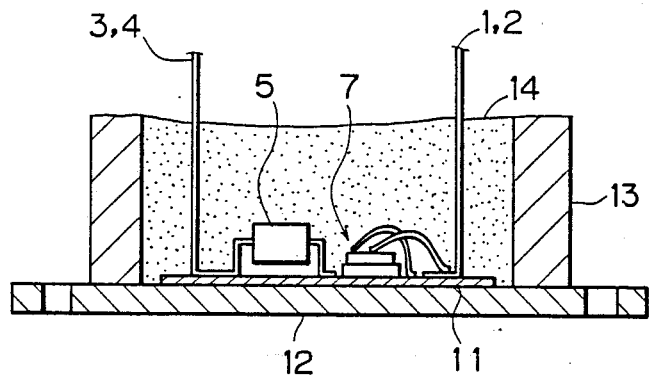
FIG. 1 is a sectional view showing a conventional semiconductor device.
Figure 2:
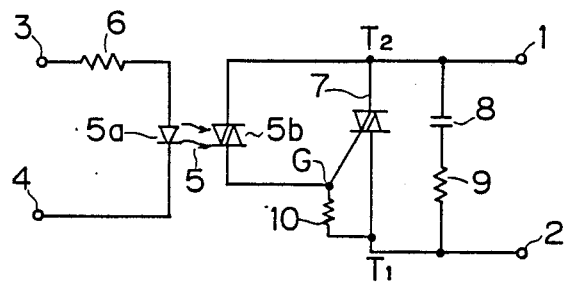
FIG. 2 is a circuit diagram showing a semiconductor device having a TRIAC and a photocoupler.
Figure 3:
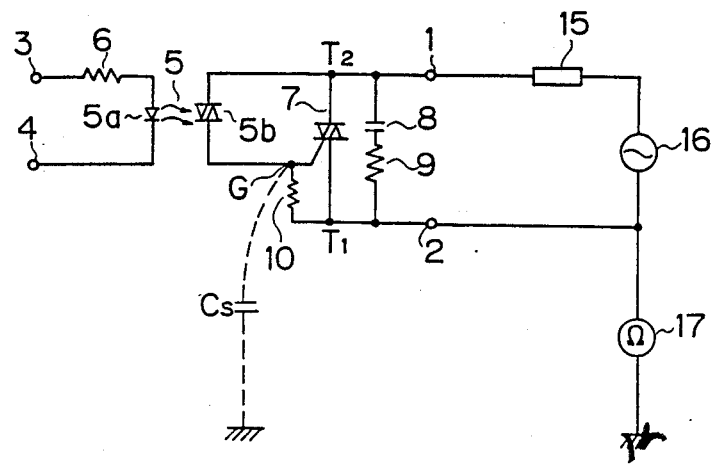
FIG. 3 is an equivalent circuit diagram of the semiconductor device shown in FIG. 1.
Figure 6:
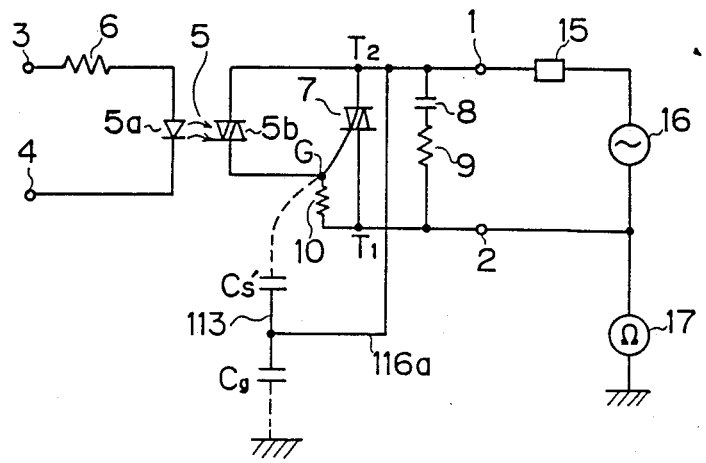
FIG. 6 is an equivalent circuit diagram corresponding to the first embodiment.

FIG. 6 is a circuit diagram showing a electronic circuit corresponding to the device shown in FIG. 5. Elements identical to those in FIG. 3 are indicated by the same reference numerals. A TRIAC coupler (photocoupler) 5, a TRIAC and resistors 6 and 10 are mounted on the metal pattern layer 115 by soldering. L-shaped terminals 1 to 4 are upwardly provided on the multilayer substrate 18. A capacitor 8 and a resistor 9 are not shown in FIG. The respective elements 5 to 10 are electrically connected by the metal pattern layer 115, along connecting relation shown in FIG. 6.

A horizontal part 1a of the output terminal 1 is soldered onto a metal region 115a included in the metal pattern layer 115. The TRIAC 7 is mounted on the horizontal part 1a. A first main electrode $T_1$ of the TRIAC 7 is connected to the second output terminal 2, and a gate electrode G is connected to the resistor 10 through the metal pattern layer 115. The lower surface of the TRIAC 7 is soldered to the horizontal part 1a of the output terminal 1, whereby the TRIAC 7 and the metal region 115a are electrically connected with each other so that the metal region 115a substantially functions as a second main electrode $T_2$.

A through hole 116 extending toward the shielding metal layer 113 through the metal region 115a and the second ceramic plate 114 is provided at a corner of the metal region 115a. The through hole 116 is filled with solder 116a, whereby the metal region 115a (the second main electrode $T_2$) and the shielding metal layer 113 are electrically connected with each other. The electrical connection through the solder 116a filled in the through hole 116 is shown as a connection 116a in FIG. 6. The semiconductor device shown in FIG. 5 is contained in a case (not shown) and sealed by resin. The metal plate 118 for heat radiation is mounted on a radiator (not shown).

In the semiconductor device of such structure, a capacitor $C_S'$ (FIG. 6) is generated between the gate electrode G and the shielding metal layer 113. Further, another capacitor $C_g$ is generated between the shielding metal layer 113 and the heat radiation metal plate 118 (or the metal layer 111). These parasitic capacitors $C_S'$ and $C_g$ are in series with each other.

When the external noise 17, which is symbolically shown as a noise source in FIG. 6, is applied, charging current of the capacitor $C_g$ flows to the second main electrode $T_2$ through the connection 116a. This charging current passes through a load 15 and an AC power source 16 to flow to a ground level. Thus, the charging current is prevented from flowing to the gate electrode G of the TRIAC 7 to undesirably turn on the TRIAC 7. Most of the current caused by the external noise flows through the capacitor $C_g$, and hence influence by the other capacitor $C_S'$ is negligible. In other words, the semiconductor circuit is shielded against the external noise by the shielding metal layer 113, while the external noise captured by the shielding metal layer 113 flows toward portions other than the gate electrode G of the TRIAC 7. As a result, no malfunction of the TRIAC 7 takes place even if the ceramic substrates and 114 are reduced in thickness to improve the heat radiating effect.

FIGS. 7A to 7E show a multilayer substrate 20 which is employed in a second embodiment of the present invention. First, refer to FIG. 7A and FIG. 7B, which is a sectional end view taken along the line B—B in FIG. 7A. The multilayer substrate 20 has a ceramic plate (insulating substrate) 204 and a metal layer 201 which is obtained by performing metallization processing on the entire lower surface of the ceramic plate 204. A metal pattern layer (electrically conductive pattern layer) 202 is provided on the upper surface of the ceramic plate 204 by metallization processing. A TRIAC 7 is placed on a metal region 202a forming a part of the metal pattern layer 202, as hereinafter described. As obvious from comparison of FIG. 7A with FIG. 4A, the metal region 202a is larger in area than the metal region 115a of the first embodiment.

Then, refer to FIG. 7C, FIG. 7D which is a sectional end view taken along the line D—D in FIG. 7C and FIG. 7E which is a sectional end view take n along the line E—E A film substrate (insulation layer) 203 is adhered to the metal region 202a to partially cover the upper surface of the metal region 202a. The film substrate 203 is formed by polyimide resin, for example, to be several 10 $\mu$m in thickness. A metal thin film pattern 205 is provided on the upper surface of the film substrate 203. The metal thin film pattern 205 includes a portion 205a connected to a gate electrode G. The resistor 10 of FIG. 6 is placed on the metal thin film pattern 205.

FIG. 7C shows a state in which the TRIAC 7 is soldered onto the metal region 202a. A first main electrode $T_1$ and the gate electrode G are connected to the upper surface of the TRIAC 7. The lower surface of the TRIAC 7 is electrically in contact with the metal region 202a, which in turn serves as a second main electrode $T_2$ of the TRIAC 7. The TRIAC 7 may be connected to the metal region 202a through a horizontal part (not shown) of an output terminal. A multilayer member 21 is formed by the multilayer substrate 20, the metal pattern layer 202 (metal region 202a) and the film substrate 203. The TRIAC coupler 5 is placed on the multilayer member 21 so that the TRIAC coupler 5 is electrically connected to the metal pattern layer 202 and the portion 205a of the metal thin film pattern 205.

Figure 8:
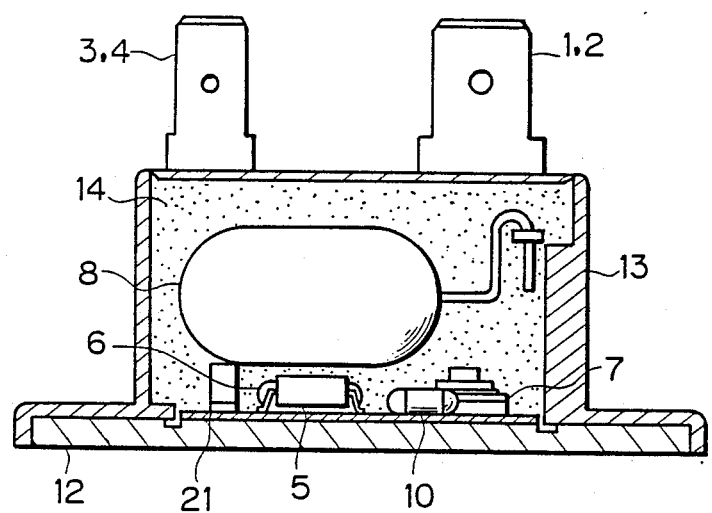
FIG. 8 is a sectional view showing a semiconductor device formed according to the second embodiment.

The multilayer member 2i shown in FIGS. 7A to 7E is soldered onto a metal plate 12 for heat radiation, as shown in FIG. 8. The TRIAC 7, a TRIAC coupler 5 and the like are mounted on the multilayer member 21. These circuit parts are contained in a case 13, to be sealed by a resin member 14 of FIG. 8. Terminals 1 to 4 extend outwardly from the case 13. Remaining elements 6, 8 and 10 shown in FIG. 8 would be easily understood with reference to FIG. 6. Namely, an electronic circuit corresponding to the second embodiment is also expressed by FIG.

With respect to the second embodiment, it is to be noted that the metal region 202a as a portion of the metal pattern layer 202 has an electrostatic shielding function similarly to the shielding metal layer 203 of the first embodiment. The external noise 17 is captured by the metal region 202a, whereby the gate electrode G of the TRIAC 7 and the metal thin film pattern layer 208 on which the resistor 10 is placed are electrically shielded against the external noise 17. The resistor 10 is connected to the gate electrode through the portion 205a of the film pattern layer 205. Since the metal region 202a itself serves as the main electrode $T_2$, charges moved through the main electrode $T_2$. Thus the second embodiment also implements an equivalent circuit which is similar to that of FIG. 6. As the result, the ceramic plate 204 can be reduced in thickness to increase diffusion of heat generated from the electronic circuit while preventing a malfunction of the TRIAC 7.

The second embodiment employs no relatively high priced member such as the multilayer substrate 18 in the first embodiment. Thus, the second embodiment can be implemented at a low cost.

While the electronic circuit including the TRIAC 7 is assembled in each of the first and second embodiments, an electronic circuit having a power semiconductor element such as another type of TRIAC, a thyristor or a power transistor may be assembled. The present invention is also applicable to a semiconductor device including a semiconductor element other than a power semiconductor element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a thyristor operating in response to a signal supplied through a photocoupler, said semiconductor device comprising:
    (a) a heat radiation metal plate for diffusing heat generated in said semiconductor device;
    (b) a multilayer member provided on said heat radiation metal plate, said multilayer member having:
    (b-1) and insulating substrate,
    (b-2) a shielding metal layer provided on said insulating substrate for shielding said semiconductor device against external noise, and
    (b-3) an insulation layer provided on said shielding metal layer; and
    (c) an electronic circuit provided on said multilayer member and having a photocoupler and a thyristor operating in response to a signal supplied through said photocoupler,
    said shielding metal layer being connected to a main electrode of said thyristor.

2. A semiconductor device in accordance with claim 1, wherein
    a conductive pattern layer is provided on said insulation layer,
    said electronic circuit being provided on said conductive pattern layer.

3. A semiconductor device in accordance with claim 2, wherein
    said electronic circuit and said shielding metal layer are electrically connected with each other through a conductive material provided in a through hole formed in said insulation layer.

4. A semiconductor device in accordance with claim 3, wherein
    said multilayer member is formed by integrating a plurality of ceramic plates having surfaces subjected to metallization processing.

5. A semiconductor device in accordance with claim 1, wherein
    said insulating substrate is provided thereon with a conductive pattern layer on which a part of said electronic circuit is placed,
    a part of said conductive pattern layer is said shielding metal layer,
    said insulation layer is provided on an upper surface of said shielding metal layer, and
    within said electronic circuit, a part connected to a control electrode of said thyristor is provided on said insulation layer.

6. A semiconductor device in accordance with claim 5, wherein
    said insulation layer is provided on a first portion of said shielding metal layer, said thyristor is placed on a second portion of said shielding metal layer, and
said shielding metal layer forms, within a plurality of electrodes of said thyristor an electrode being different from said control electrode.

7. A semiconductor device in accordance with claim 6, wherein
said insulating substrate is formed by a ceramic plate and said insulation layer is prepared by a resin film.

* * * * *